US012677386B2

(12) United States Patent　　　(10) Patent No.:　US 12,677,386 B2
Dijkstra et al.　　　　　　　　　　(45) Date of Patent:　　　Jul. 7, 2026

(54) STANDALONE CONTROLLER

(71) Applicant: LUMAFLEX LLC, Minneapolis, MN (US)

(72) Inventors: Alain Dijkstra, Amstelveen (NL); John Graham Harper, Minneapolis, MN (US); Liu Si Yuan, Minneapolis, MN (US); Chen Shoufeng, Shenzhen (CN)

(73) Assignee: LUMAFLEX LLC, Minneapolis, MN (US)

( * ) Notice: Subject to any disclaimer, the term of this patent is extended or adjusted under 35 U.S.C. 154(b) by 366 days.

(21) Appl. No.: 18/411,077

(22) Filed: Jan. 12, 2024

(65) Prior Publication Data

US 2025/0234464 A1　　　Jul. 17, 2025

(51) Int. Cl.
　　*H05K 5/02*　　　　(2006.01)
　　*H05K 7/14*　　　　(2006.01)
(52) U.S. Cl.
　　CPC ......... *H05K 5/0217* (2013.01); *H05K 5/0247* (2013.01); *H05K 7/1427* (2013.01)
(58) Field of Classification Search
　　CPC .. H05K 5/0247; H05K 5/0017; H05K 5/0217; H05K 7/1427; H05K 7/1471
　　USPC .......................... 361/728, 730, 752, 796, 800
　　See application file for complete search history.

(56) References Cited

U.S. PATENT DOCUMENTS

| | | | | |
|---|---|---|---|---|
| 2003/0227394 A1* | 12/2003 | Rothgeb | ............. | A47L 15/4297 340/870.01 |
| 2008/0053979 A1* | 3/2008 | Toya | .................. | A61H 23/0263 219/385 |
| 2008/0311763 A1* | 12/2008 | Dubuc | ................... | H02K 5/225 439/18 |
| 2014/0358204 A1* | 12/2014 | Dickie | ................... | A61F 7/007 607/109 |
| 2019/0111276 A1 | 4/2019 | Tapper et al. | | |
| 2023/0241407 A1 | 8/2023 | Cassano et al. | | |

FOREIGN PATENT DOCUMENTS

| | | | | | |
|---|---|---|---|---|---|
| JP | 2005339078 A | * | 12/2005 | ............. | G08C 17/00 |

* cited by examiner

*Primary Examiner* — Hung S. Bui
(74) *Attorney, Agent, or Firm* — Willie Jacques; Emanus LLC

(57)　　　　　　ABSTRACT

Embodiments of the present invention provide a standalone controller for detachably attaching to an electronic device to perform monitoring and control of operational characteristics of the electronic device. The standalone controller includes a housing defining an enclosed cavity, the housing including an upper portion and a lower portion. The standalone controller further includes at least two power terminals, the at least two power terminals located in at least two respective holes provided in the lower portion. The standalone controller further includes a Printed Circuit Board (PCB) located within the enclosed cavity. A power source is electrically coupled to the PCB. Also, at least two conducting elements are electrically coupled to the PCB for transmitting electrical power received from the power source. Also, contacts between the lower portion and the at least two power terminals are sealed at locations of the at least two respective holes for ingress protection.

20 Claims, 7 Drawing Sheets

700

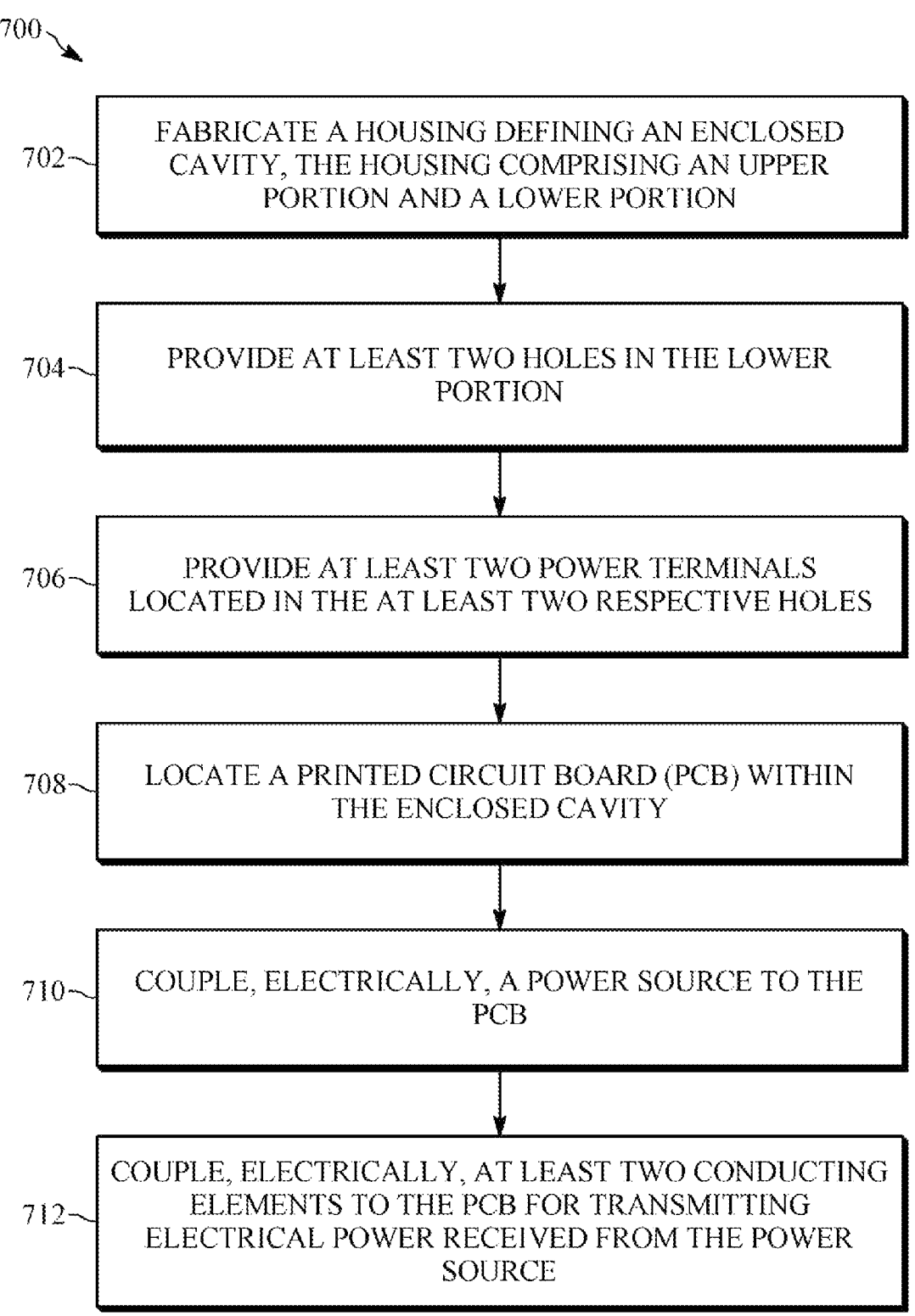

| | |
|---|---|
| 702 | FABRICATE A HOUSING DEFINING AN ENCLOSED CAVITY, THE HOUSING COMPRISING AN UPPER PORTION AND A LOWER PORTION |
| 704 | PROVIDE AT LEAST TWO HOLES IN THE LOWER PORTION |
| 706 | PROVIDE AT LEAST TWO POWER TERMINALS LOCATED IN THE AT LEAST TWO RESPECTIVE HOLES |
| 708 | LOCATE A PRINTED CIRCUIT BOARD (PCB) WITHIN THE ENCLOSED CAVITY |
| 710 | COUPLE, ELECTRICALLY, A POWER SOURCE TO THE PCB |
| 712 | COUPLE, ELECTRICALLY, AT LEAST TWO CONDUCTING ELEMENTS TO THE PCB FOR TRANSMITTING ELECTRICAL POWER RECEIVED FROM THE POWER SOURCE |

FIG. 7

STANDALONE CONTROLLER

TECHNICAL FIELD

The present invention relates generally to devices and subsystems used in automation and control. More specifically, the present invention relates to devices that can be configured and used for several electronic devices for achieving instrumentation and control.

BACKGROUND ART

Instrumentation and control for electronic devices are generally embedded in structures of the very same devices. For achieving targeted operational characteristics of an electronic device, the electronic device may be provided with a Printed Circuit Board (PCB) installed with several electronic components and sub-circuits that serve purposes like AC to DC conversion, DC to AC inversion, signal filtering, signal amplification, timekeeping, etc. In several advanced instrumentation and control devices, control is performed using System-on-Chip (SOC) configurations, individually installed processors, and volatile and non-volatile memory units.

However, integration of the control and instrumentation into the electronic devices leads to an increase in overall costs and design complexities. Moreover, in several instances when an electronic device breaks down or becomes dysfunctional, the control and instrumentation components may still be preserved while the damage may be limited to peripheral devices such as touch interfaces and display units. However, in such scenarios, the entire electronic device including the instrumentation and control components are discarded, where they could still have been recycled and/or reused. Therefore, to achieve the recyclability or reusability of the instrumentation and control components, the design of the electronic device would need to be modular thereby enabling relatively convenient disassembly of the electronic device. In addition, there may be scenarios where a single instrumentation and control architecture may be configured to operate several kinds of devices. Therefore, it may be desirable that the instrumentation and control architecture be sold separately so that it can attached and detached from one electronic device and then reattached to another electronic device.

Therefore, there is a need for a standalone controller that overcomes the disadvantages and limitations associated with the prior art and provides a more satisfactory solution.

OBJECTS OF THE INVENTION

Some of the objects of the invention are as follows:

An object of the present invention is to provide a standalone controller that can be used to operate and control several discrete electronic devices.

Another object of the present invention is to provide a standalone controller that can be conveniently mechanically attached to and detached from several discrete electronic devices.

Another object of the present invention is to provide a standalone controller that includes protection against adverse incidents that might occur due to reverse polarity connections.

Another object of the present invention is to provide a standalone controller that prevents Electromotive force (EMF) generated by inbuilt electronic components from leaking into the surroundings of the standalone controller.

It is also an object of the present invention to provide a standalone controller that can execute control logic coded in a memory unit using a processor.

SUMMARY OF THE INVENTION

According to a first aspect of the present invention, there is provided a standalone controller for detachably attaching to an electronic device to perform monitoring and control of operational characteristics of the electronic device. The standalone controller includes a housing defining an enclosed cavity, the housing including an upper portion and a lower portion. The standalone controller further includes at least two power terminals, the at least two power terminals located in at least two respective holes provided in the lower portion. Furthermore, the standalone controller includes a Printed Circuit Board (PCB) located within the enclosed cavity. The standalone controller further includes a power source electrically coupled to the PCB. Also, the standalone controller includes at least two conducting elements electrically coupled to the PCB for transmitting electrical power received from the power source. At least one conducting element of the at least two conducting elements is maintained at a positive potential and at least one other conducting element is maintained at a negative potential, the at least two conducting elements configured to make physical contact with the at least two respective power terminals. The at least two power terminals are made from a ferromagnetic or a paramagnetic material. Also, contacts between the lower portion and the at least two power terminals are sealed at locations of the at least two respective holes for ingress protection.

In one embodiment of the invention, the at least two power terminals are provided within the enclosed cavity at a predetermined depth from a lower outer surface of the lower portion, the at least two power terminals accessible through the at least two respective holes provided in the lower portion, the at least two holes configured to receive therewithin at least two respective load terminals of the electronic device.

In one embodiment of the invention, the at least two conducting elements comprise at least two dowel pins that are spring loaded.

In one embodiment of the invention, the standalone controller further includes a reverse polarity protection element electrically coupled to the PCB.

In one embodiment of the invention, the reverse polarity protection element comprises a bridge rectifier circuit.

In one embodiment of the invention, the power source comprises rechargeable and/or replaceable batteries.

In one embodiment of the invention, the power source comprises rechargeable batteries. A power transfer port is electrically coupled to the power source. Also, the power source is configured to both receive and deliver electrical power through the power transfer port.

In one embodiment of the invention, the standalone controller further includes a user interface, the user interface configured to receive a control input signal corresponding to modifying operational characteristics of the electronic device, the operational characteristics of the electronic device modified in response to the receipt of the control input signal through the user interface.

In one embodiment of the invention, the electronic device is a therapeutic and/or a recreational device comprising a plurality of stimulation elements, the plurality of stimulation elements selected from a group consisting of irradiation sources, heating elements, cooling elements, vibration elements, electrodes and combinations thereof.

In one embodiment of the invention, in case of the plurality of stimulation elements comprising the irradiation sources, the operational characteristics comprise wavelength of the electromagnetic radiation emitted by the irradiation sources, mode of operation of the irradiation sources, and pulse width of pulses of the emitted electromagnetic radiation in a pulsed mode of operation of the irradiation sources.

In one embodiment of the invention, the standalone controller further includes at least two insulator elements provided between the at least two power terminals and a lower PCB surface facing towards the at least two power terminals, such that, only the at least two dowel pins make electrically conducting contacts with the at least two respective power terminals.

In one embodiment of the invention, the upper portion comprises cutouts for releasing Electromotive force (EMF) generated by electronic components within the housing from the upper portion and away from the electronic device.

In one embodiment of the invention, the housing is made from a shielding material to prevent Electromotive force (EMF) generated by electronic components within the housing from leaking from the lower portion of the housing.

In one embodiment of the invention, the standalone controller further includes a processor, a memory unit, and a communication interface electrically coupled to the PCB, the memory unit comprising machine-readable instructions that when executed by the processor, enable the processor to receive, from a user computing device, through the communication interface, a control input signal corresponding to modifying operational characteristics of the electronic device, and modify the operational characteristics of the electronic device in response to the receipt of the control input signal.

According to a second aspect of the present invention, there is provided a standalone controller for detachably attaching to an electronic device to perform monitoring and control of operational characteristics of the electronic device. The standalone controller includes a housing defining an enclosed cavity, the housing including an upper portion and a lower portion. Furthermore, the standalone controller includes at least two power terminals, the at least two power terminals located in two respective holes provided in the lower portion. The standalone controller further includes a Printed Circuit Board (PCB) located within the enclosed cavity. A power source is electrically coupled to the PCB. At least two conducting elements are electrically coupled to the PCB for transmitting electrical power received from the power source, with at least one conducting element maintained at a positive potential and at least one other conducting element maintained at a negative potential, the at least two conducting elements configured to make physical contact with the at least two respective power terminals. Also, the standalone controller includes a reverse polarity protection element electrically coupled to the PCB. The at least two power terminals are made from a ferromagnetic or a paramagnetic material. Furthermore, contacts between the lower portion and the at least two power terminals are sealed at locations of the at least two respective holes for ingress protection. Also, the housing is made from a shielding material to prevent Electromotive force (EMF) generated by electronic components within the housing from leaking to surrounding environment of the housing.

In one embodiment of the invention, the at least two power terminals are provided within the enclosed cavity at a predetermined depth from a lower outer surface of the lower portion, the at least two power terminals accessible through the at least two respective holes provided in the lower portion, the at least two holes configured to receive therewithin at least two respective load terminals of the electronic device.

In one embodiment of the invention, the at least two conducting elements comprise at least two dowel pins that are spring loaded.

In one embodiment of the invention, the upper portion comprises cutouts for releasing Electromotive force (EMF) generated by electronic components within the housing from the upper portion and away from the electronic device.

According to a third aspect of the present invention there is provided a system of a plurality of standalone controllers for detachably attaching to a plurality of respective electronic devices to perform monitoring and control of operational characteristics of the plurality of electronic devices. Each one of the plurality of standalone controllers includes a housing defining an enclosed cavity, the housing includes an upper portion and a lower portion. Furthermore, the each one of the plurality of standalone controllers at least two power terminals, the at least two power terminals located in at least two respective holes provided in the lower portion. The each one of the plurality of standalone controllers further includes a Printed Circuit Board (PCB) located within the enclosed cavity. Furthermore, a power source is electrically coupled to the PCB. Also, the each one of the plurality of standalone controllers includes at least two conducting elements electrically coupled to the PCB for transmitting electrical power received from the power source, at least one conducting element maintained at a positive potential and at least one other conducting element maintained at a negative potential, the at least two conducting elements configured to make physical contact with the at least two respective power terminals. The at least two power terminals are made from a ferromagnetic or a paramagnetic material. Further, contacts between the lower portion and the at least two power terminals are sealed at locations of the at least two respective holes for ingress protection. Also, the plurality of standalone controllers are configured communicate with each other through wired and/or wireless means, such that, one standalone controller of the plurality of standalone controllers, selected based on predetermined criterion, is configured to act as a master controller and remaining standalone controllers of the plurality of standalone controllers are configured to act as slave controllers, the slave controllers configured to operate in accordance with respective control input signals received from the master controller.

In one embodiment of the invention, the at least two conducting elements include at least two dowel pins that are spring loaded.

In one embodiment of the invention, the housing is made from a shielding material to prevent Electromotive force (EMF) generated by electronic components within the housing from leaking from the lower portion of the housing.

In the context of the specification, the term "processor" refers to one or more of a microprocessor, a microcontroller, a general-purpose processor, a Field Programmable Gate Array (FPGA), or an Application Specific Integrated Circuit (ASIC), and the like.

In the context of the specification, the phrase "memory unit" refers to volatile storage memory, such as Static Random Access Memory (SRAM) and Dynamic Random Access Memory (DRAM) of types such as Asynchronous DRAM, Synchronous DRAM, Double Data Rate SDRAM, Rambus DRAM, and Cache DRAM, etc.

In the context of the specification, the phrase "storage device" refers to a non-volatile storage memory such as EPROM, EEPROM, flash memory, or the like.

In the context of the specification, the phrase "communication interface" refers to a device or a module enabling direct connectivity via wires and connectors such as USB, HDMI, VGA, or wireless connectivity such as Bluetooth or Wi-Fi, or Local Area Network (LAN) or Wide Area Network (WAN) implemented through TCP/IP, IEEE 802.x, GSM, CDMA, LTE, or other equivalent protocols.

In the context of this specification, terms like "light", "radiation", "irradiation", "emission" and "illumination", etc. refer to electromagnetic radiation in frequency ranges varying from the Ultraviolet (UV) frequencies to Infrared (IR) frequencies and wavelengths, wherein the range is inclusive of UV and IR frequencies and wavelengths. It is to be noted here that UV radiation can be categorized in several manners depending on respective wavelength ranges, all of which are envisaged to be under the scope of this invention. For example, UV radiation can be categorized as, Hydrogen Lyman-$\alpha$ (122-121 nm), Far UV (200-122 nm), Middle UV (300-200 nm), and Near UV (400-300 nm). The UV radiation may also be categorized as UVA (400-315 nm), UVB (315-280 nm), and UVC (280-100 nm) Similarly, IR radiation may also be categorized into several categories according to respective wavelength ranges which are again envisaged to be within the scope of this invention. A commonly used subdivision scheme for IR radiation includes Near IR (0.75-1.4 μm), Short-Wavelength IR (1.4-3 μm), Mid-Wavelength IR (3-8 μm), Long-Wavelength IR (8-15 μm) and Far IR (15-1000 μm).

In the context of the specification, a "polymer" is a material made up of long chains of organic molecules (having eight or more organic molecules) including, but not limited to, carbon, nitrogen, oxygen, and hydrogen as their constituent elements. The term polymer is envisaged to include both naturally occurring polymers such as wool, and synthetic polymers such as polyethylene and nylon.

In the context of the specification, a "diaphanous material" is a material that allows at least a portion of one or more forms (such as Infrared, Ultraviolet, X-Rays, Visible Light, Microwaves, Radio Waves, etc.) of electromagnetic radiation to pass through them. The diaphanous materials can be transparent (allowing the one or more forms of the electromagnetic radiation to pass through with minimal scattering) or translucent (allowing the one or more forms of the electromagnetic radiation to pass through with appreciable diffusion or scattering). Diaphanous materials can be dense, like glass, or have an open structure, like wire mesh or a woven fabric.

In the context of the specification, the phrase "negative potential" refers to potential energy of an electrical field determined at a location where the potential energy of the electrical field (also referred to as "electrical potential energy") attains a minimum value for a given system under observation. For example, in a DC circuit, the negative potential is the electrical potential energy at the negative terminal of a battery or a battery system.

In the context of the specification, the phrase "positive potential" refers to potential energy of an electrical field determined at a location where the electrical potential energy is greater than the minimum value of the electrical potential energy for the given system under observation. For example, in a DC circuit, the positive potential may be the electrical potential energy at the positive terminals of a diode, a resistor, a capacitor, an inductor, or a positive terminal of a battery or a battery system.

In the context of the specification, "Light Emitting Diodes (LEDs)" refer to semiconductor diodes capable of emitting electromagnetic radiation when supplied with an electric current. The LEDs are characterized by their superior power efficiencies, smaller sizes, rapidity in switching, physical robustness, and longevity when compared with incandescent or fluorescent lamps. In that regard, the plurality of LEDs may be through-hole type LEDs (generally used to produce electromagnetic radiations of red, green, yellow, blue and white colors), Surface Mount Technology (SMT) LEDs, Bi-color LEDs, Pulse Width Modulated RGB (Red-Green-Blue) LEDs, and high-power LEDs, etc.

Materials used in the one or more LEDs may vary from one embodiment to another depending upon the frequency of radiation required. Different frequencies can be obtained from LEDs made from pure or doped semiconductor materials. Commonly used semiconductor materials include nitrides of Silicon, Gallium, Aluminum, and Boron, and Zinc Selenide, etc. in pure form or doped with elements such as Aluminum and Indium, etc. For example, red and amber colors are produced from Aluminum Indium Gallium Phosphide (AlGaInP) based compositions, while blue, green, and cyan use Indium Gallium Nitride based compositions. White light may be produced by mixing red, green, and blue lights in equal proportions, while varying proportions may be used for generating a wider color gamut. White and other colored lightings may also be produced using phosphor coatings such as Yttrium Aluminum Garnet (YAG) in combination with a blue LED to generate white light and Magnesium doped potassium fluorosilicate in combination with blue LED to generate red light. Additionally, near Ultraviolet (UV) LEDs may be combined with europium-based phosphors to generate red and blue lights and copper and zinc doped zinc sulfide-based phosphor to generate green light.

In addition to conventional mineral-based LEDs, one or more LEDs may also be provided on an Organic LED (OLED) based flexible panel or an inorganic LED-based flexible panel. Such OLED panels may be generated by depositing organic semiconducting materials over Thin Film Transistor (TFT) based substrates. Further, discussion on generation of OLED panels can be found in Bardsley, J. N (2004), "*International OLED Technology Roadmap*", *IEEE Journal of Selected Topics in Quantum Electronics*, Vol. 10, No. 1, that is included herein in its entirety, by reference. An exemplary description of flexible inorganic light-emitting diode strips can be found in granted U.S. Pat. No. 7,476,557 B2, titled "Roll-to-roll fabricated light sheet and encapsulated semiconductor circuit devices", which is included herein in its entirety, by reference.

In several embodiments, the one or more LEDs may also be micro-LEDs described through U.S. Pat. Nos. 8,809,126 B2, 8,846,457 B2, 8,852,467 B2, 8,415,879 B2, 8,877,101 B2, 9,018,833 B2 and their respective family members, assigned to NthDegree Technologies Worldwide Inc., which are included herein by reference, in their entirety. The one or more LEDs, in that regard, may be provided as a printable composition of the micro-LEDs, printed on a substrate.

BRIEF DESCRIPTION OF THE ACCOMPANYING DRAWINGS

The accompanying drawings illustrate the best mode for carrying out the invention as presently contemplated and set forth hereinafter. The present invention may be more clearly understood from a consideration of the following detailed description of the preferred embodiments taken in conjunction with the accompanying drawings wherein like reference letters and numerals indicate the corresponding parts in various figures in the accompanying drawings, and in which.

Figure 6:
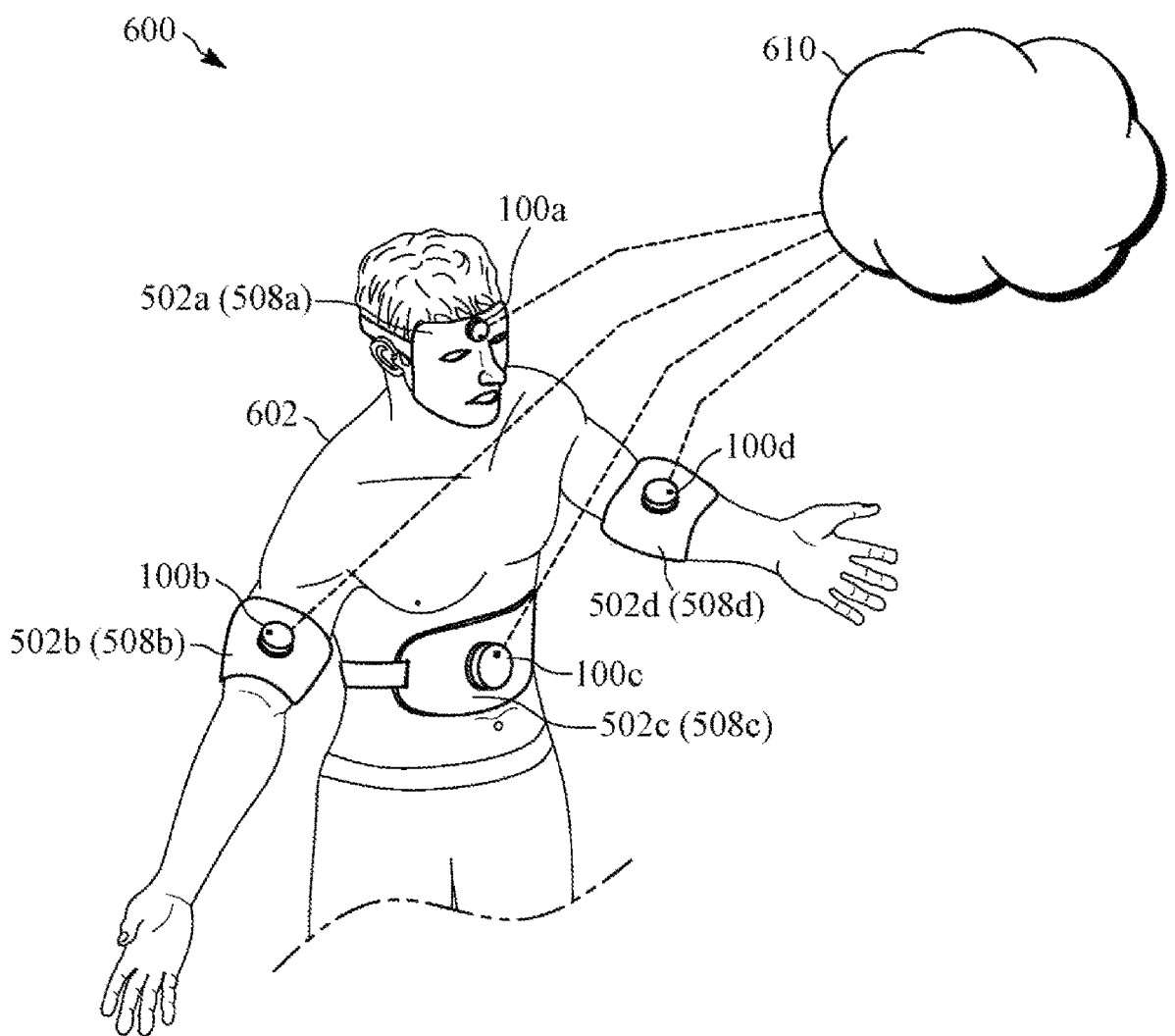

FIG. 6 illustrates a system including a plurality of standalone controllers coupled to a plurality of respective stimulation devices, the plurality of standalone controllers communicating through a communication network, in accordance with an embodiment of the present invention; and FIG. 7 illustrates method of manufacturing a standalone controller, in accordance with an embodiment of the present invention.

DETAILED DESCRIPTION

Embodiments of the present invention disclosure will be described more fully hereinafter with reference to the accompanying drawings in which like numerals represent like elements throughout the figures, and in which example embodiments are shown.

The detailed description and the accompanying drawings illustrate the specific exemplary embodiments by which the disclosure may be practiced. These embodiments are described in detail to enable those skilled in the art to practice the invention illustrated in the disclosure. It is to be understood that other embodiments may be utilized, and other changes may be made, without departing from the spirit or scope of the present disclosure. The following detailed description is therefore not to be taken in a limiting sense, and the scope of the present invention disclosure is defined by the appended claims. Embodiments of the claims may, however, be embodied in many different forms and should not be construed as limited to the embodiments set forth herein.

Embodiments of the present invention provide a standalone controller (hereinafter also referred to as "the controller") for electronic devices. The controller is envisaged to perform monitoring and control of the operational characteristics of an electronic device to which the controller would be attached. In that regard, the controller is envisaged to include a housing including an upper portion and a lower portion. At least two power terminals may be located in at least two respective holes provided in the lower portion. For example, the at least two power terminals may be provided at a predetermined depth from a lower outer surface of the lower portion, such that the power terminals may be accessible through the respective holes provided in the lower outer surface of the lower portion. Further, contacts between the lower portion and the power terminals may be sealed at the locations of the holes, for Ingress Protection (IP) from dust and water entry. The power terminals may further be in electrical communication with a Printed Circuit Board (PCB) through an equal number of conducting elements such as, but not limited to, electrically conducting links, bars, wires, cords, or spring-loaded dowel pins. The springs in the spring-loaded dowel pins ensure that contact between the power terminals and the dowel pins is never broken even when the dowel pins wear off or when other metallic components of the controller expand and contract with changes in ambient temperature.

A power source, such as a DC battery, or an AC power source such as an AC power supply or an inverter may be connected in between the conducting elements to power the controller. To protect the controller from damage that may occur due to a reverse polarity connection, a reverse polarity protection element, such as a bridge rectifier may be provided between the conducting elements. The controller may be connected with the electronic device when protruding load terminals of the electronic device are inserted in the holes provided in the lower portion of the housing for accessing the power terminals. In that regard, for achieving a stable coupling between the electronic device and the controller, the protruding load terminals of the electronic device may be made up of permanent magnets and the power terminals may be made up of ferromagnetic or paramagnetic materials. Some of the examples of ferromagnetic materials include Iron, Nickel, Cobalt, Gadolinium, Dysprosium, Magnetite, etc. Some of the examples of paramagnetic materials include Aluminum, Manganese, Chromium, Platinum, Crown Glass, etc. However, in several alternate embodiments, the power terminals may be made up of permanent magnets and the load terminals may be made up of the ferromagnetic or the paramagnetic materials. The housing in itself may be made up of a shielding material material to prevent Electromotive force (EMF) generated by the electronic components of the controller from leaking from the lower portion and hence from leaking towards the electronic device. Such shielding materials may include, but are not limited to, metals (such as copper, aluminum, brass, nickel, silver, steel, and tin), conductive fabric, intrinsic conducting polymer materials, carbon foam and carbon materials, and elastomers and textile fibers. Furthermore, vents, openings, or slots may be provided in the upper portion to enable the EMF to be released from the upper portion.

The controller may be operable through a user interface provided at any of the top portion, the lower portion, or the lateral portions of the controller. The user interface in that regard may include one or more physical buttons or keys, capacitive touch sensors, resistive touch sensors, and the like. In several alternate embodiments, the controller may be provided with a processor, a memory unit, and a communication interface enabling the controller to operate automatically on reprogrammable machine-readable instructions. The communication interface may allow the controller to communicate and receive control inputs from user computing devices such as smartphones, tablet PCs, notebook PCs, and the like. Additionally, the communication interface may also allow the controller to transmit or receive the control inputs to or from other similar controllers, respectively.

Embodiments of the present invention further provide a method for manufacturing a standalone controller. The controller may be manufactured by first individually fabricating or procuring constituent components such as the housing, the power terminals, the spring-loaded dowel pins, power source(s) such as batteries, AC/DC rectifier, DC/AC inverter, amplifiers, etc. and then assembling the individual components to obtain a finished controller. Further, reverse polarity protection element may be provided between the conducting elements, a user interface capable of receiving control inputs may be electrically coupled to the PCB, and an insulator layer may be added between the power terminals and a surface of the PCB facing the power terminals.

Embodiments of the present invention also provide a system of a plurality of standalone controllers. The system of several controllers may act as a self-contained system in which the controllers may communicate with each other. At any given instant, one of the controllers may be automatically configured to act as a master controller and other controllers may be configured to act as slave controllers receiving control inputs from the master controller. Such systems of controllers may be applicable in Internet of Things applications or in scenarios where the corresponding electronic devices may be wearables worn on several parts of the body of the user. The communicating wearables may be able to monitor several bio-indicators such as pulse rate, blood pressure, oxygen saturation, body temperature, etc., and provide a synchronized effect for a more efficient therapeutic and/or recreational effect.

Several embodiments of the present invention will now be discussed in detail taking FIGS. 1A-7 as reference.

Figure 1A:
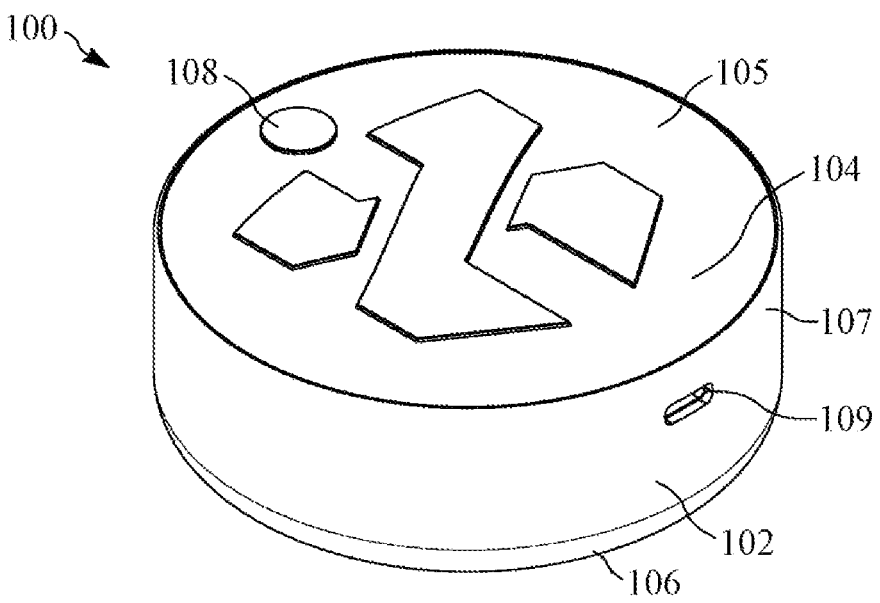
FIG. 1A illustrates a top perspective view of a standalone controller, in accordance with an embodiment of the present invention.
Figure 1B:
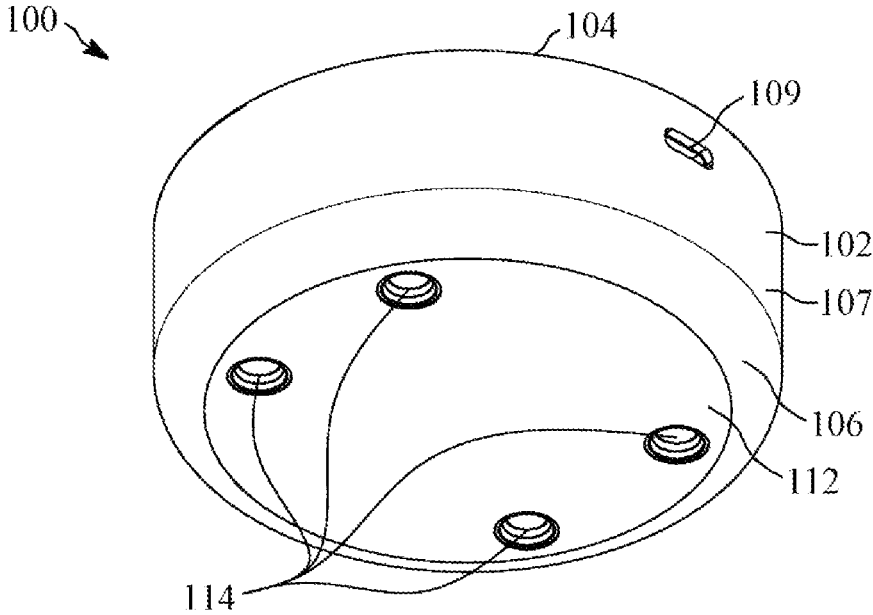
FIG. 1B illustrates a bottom perspective view of the standalone controller of FIG. 1A.

FIG. 1A illustrates a top-perspective view of a standalone controller 100 (hereinafter referred to as "the controller 100"), in accordance with an embodiment of the present invention. FIG. 1B illustrates a bottom perspective view of the controller 100 of FIG. 1A. The controller 100 is configured to be detachably attached to an electronic device to perform monitoring and control of operational characteristics of the electronic device. The controller 100 includes a housing 102 for securing most of the electronic and other components of the controller 100 to prevent them from exposure to environmental insults such as water, dust, variations in temperature and humidity, etc. The housing 102 may be constructed from metallic materials such as Aluminum, Tin, alloys of Iron, and the like. In several alternate embodiments, the housing 102 may be constructed from polymeric materials such as Acrylonitrile Butadiene Styrene (ABS), Polyvinyl Chloride (PVC), Polypropylene (PP), etc. However, the use of shielding materials such as metals (such as copper, aluminum, brass, nickel, silver, steel, and tin), conductive fabric, intrinsic conducting polymer materials, carbon foam and carbon materials, and elastomers and textile fibers, prevents Electromotive force (EMF) generated by electronic components of the controller 100 from leaking into the ambient atmosphere or immediate surroundings of the controller 100.

The housing 102 includes an upper portion 104 and a lower portion 106. The upper portion 104 and the lower portion 106 together define an enclosed cavity. In that regard, the upper portion 104 and the lower portion 106 may be coupled using internal-external thread combination provided on lateral surfaces of the upper 104 and the lower 106 portions, through snap-fit arrangements, through threaded fasteners such as screws and bolts, or through clamps or clips, etc. The upper portion 104 includes an upper outer surface 105 that is exposed to the ambient and in use will be facing away from the electronic device. A user interface 108 has been provided on the upper outer surface 105. In several embodiments of the invention, the user interface 108 may include several keys or buttons for switching the controller 100 on and off, and mode selection between operational modes of the electronic device to which the controller 100 may be detachably attached. Alternately, the user interface 108 may include resistive or capacitive touch sensors that may or may not be provided with an LED or LCD-based display unit. The user interface 108 is configured to receive a control input signal corresponding to modifying the operational characteristics of the electronic device. In that regard, the operational characteristics of the electronic device are modified in response to the receipt of the control input signal through the user interface 108.

Figure 2:
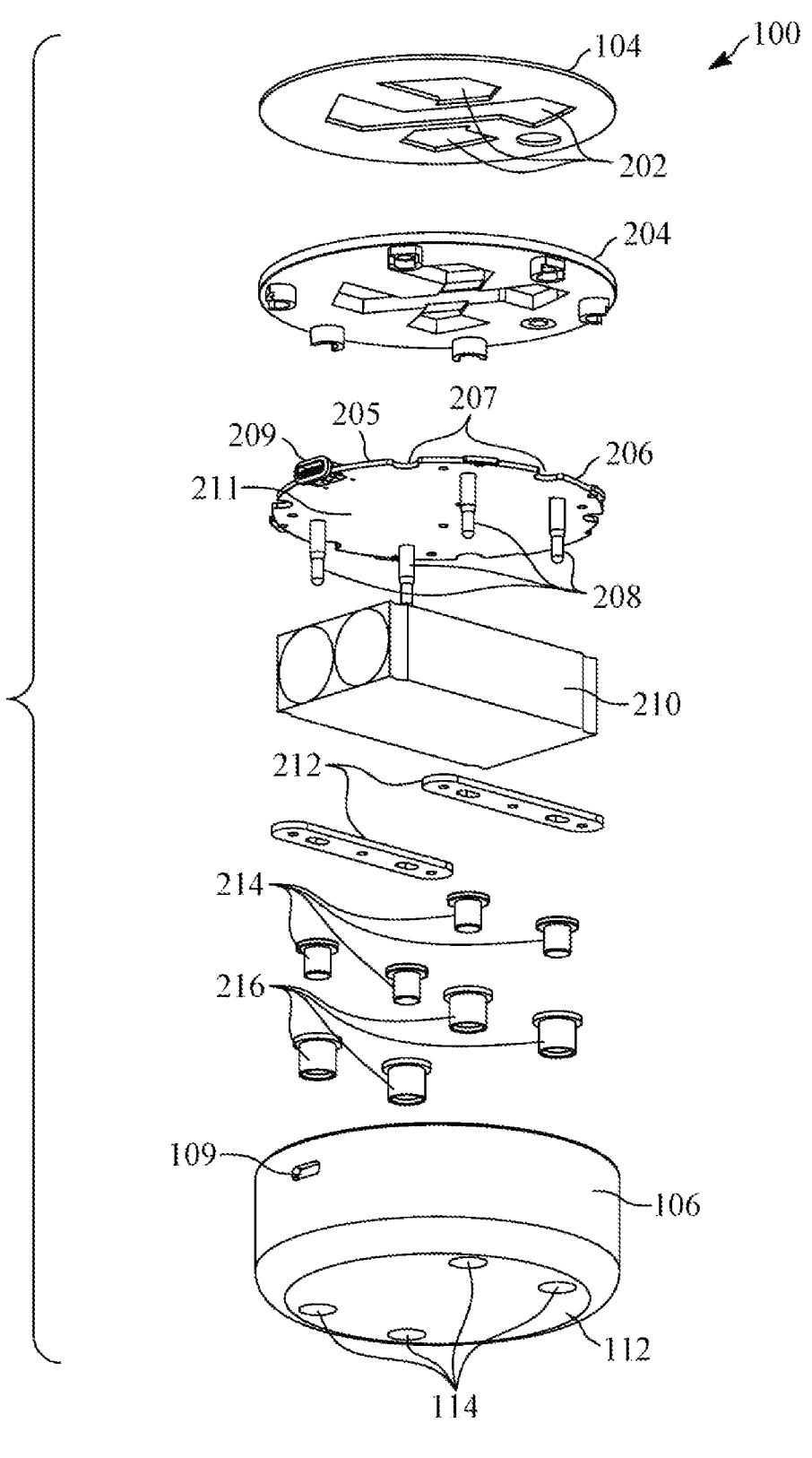
FIG. 2 illustrates an exploded view of the standalone controller, in accordance with an embodiment of the invention.

In addition, a lateral portion 107 of the housing 102 also contains a power transfer cutout 109 for a power transfer port (See FIG. 2). In several embodiments of the invention, the lateral portion 107 may be integrally formed with the lower portion 106. In several alternate embodiments, the lateral portion 107 may be integrally formed with the upper portion 102. In several alternate embodiments, the upper portion 104 and the lower portion 106 may be removably fastened with the lateral portion 107 through threads, snap-fit arrangements, adhesive bonding, and the like. The lower portion 106 includes a lower outer surface 112 facing the ambient at a bottom of the housing 100. The lower outer surface 112 has been provided with at least two holes 114. It is envisaged that the electronic device will be connected to the controller 100 through the at least two holes 114. Further significance of the plurality of holes 114 will be discussed in the following discussion.

FIG. 2 illustrates an exploded view of the controller 100, in accordance with an embodiment of the invention. The upper portion 104 includes cutouts 202 for releasing the EMF generated by the electronic components within the housing 102 from the upper portion 104 and away from the electronic device. An insulating layer 204 made from a polymeric material such as Ethylene Propylene Diene Monomer (EPDM) may be provided between a Printed Circuit Board (PCB) 206 and the upper portion 104. The PCB 206 may be a flexible PCB or a relatively rigid PCB and is located within the cavity enclosed by the upper portion 104 and the lower portion 106. Further, the PCB 206 has been provided with a plurality of rotation arresting slots 207 configured to mate with several respective rotation arresting protrusions (See FIG. 3) of the lower portion 206, to arrest relative rotation between the PCB 206 and the lower portion 106. The PCB 206 has also been provided with a power transfer port 209 on an upper PCB surface 205 of the PCB 206. The power transfer port 209 is configured to be aligned with the power transfer cutout 109.

In addition, at least two conducting elements 208 have been electrically coupled to the PCB 206 at a lower PCB surface 211. The at least two conducting elements 208 are configured for transmitting electrical power received from a power source 210. In several embodiments of the invention, the at least two conducting elements 208 include at least two dowel pins that are spring loaded. The spring-loaded dowel pins as the at least two conducting elements 208 ensure that the at least two conducting elements 208 are always in contact with at least two respective power terminals 214 of the controller 100, even when tips of the at least two conducting terminals 208 wear off or distort due to temperature variations. The permanent contact of the at least two conducting terminals 208 with the at least two respective power terminals 214 ensures efficient electrical conduction and prevents arcing in the controller 100. However, the at least two conducting elements 208 may also be embodied as electrically conducting links, bars, wires, cables, cords, etc. At least one of the at least two conducting elements 208 is maintained at a positive potential and at least one other of the at least two conducting elements is maintained at a negative potential.

FIG. 2 depicts four (4) conducting elements 208 connected to the PCB 206, two each maintained at a positive potential and a negative potential. The at least two power terminals 214 are located in the at least two respective holes 114 provided in the lower portion 106. For example, in several embodiments of the invention, the at least two power terminals 214 are configured to be provided within the enclosed cavity and at a predetermined depth from the lower outer surface 112 of the lower portion 106. In that regard, the at least two power terminals 214 may be accessible through the at least two respective holes 114. The at least two power terminals 214 are configured to be installed with the lower portion 106 through at least two respective sleeve inserts 216 inserted in the at least two respective holes 114. The at least two sleeve inserts 216 prevent the at least two power terminals 214 from wear and tear, and after extended usage of the controller 100, only the at least two sleeve inserts 216 would need to be replaced while keeping the at least two power terminals 214 intact.

In several embodiments of the invention, the power source 210 includes rechargeable and/or replaceable batteries. In several alternate embodiments of the invention, the power source 210 may include a port for receiving an AC power supply followed by an AC/DC rectifier, a step-down transformer, and the like. In that regard, the power transfer port 209 may be electrically coupled to the power source 210 and may be configured to receive a charging cable for recharging the rechargeable batteries of the power source 210. Moreover, in some embodiments, the power transfer port 209 may be configured for both receiving the electrical power to charge the batteries and delivering excess electrical power to another device while acting as a source of power. In several alternate embodiments, the power transfer port 209 may act as a receptacle for receiving an AC power supply which may further be stepped down and rectified downstream.

Also, the electronic device is envisaged to be connected to the controller 100 through at least two load terminals (See FIG. 5) of the electronic device. The at least two load terminals are configured to be protruding outwards from the electronic device, in a manner that the at least two load terminals are inserted in the at least two respective holes 114 and upper surfaces of the at least two load terminals are brought in contact with lower surfaces of the at least two power terminals 214 forming a metal-to-metal contact over one surface each. Such a contact may not always be most efficient at electrical power transmission due to inherent surface irregularities of metallic surfaces. Therefore, the at least two sleeve inserts 216 enable outer lateral surfaces of the at least two load terminals to also receive power from the lateral inner surfaces of the at least two sleeve inserts 216, thereby considerably increasing the efficiency of electrical power transfer. In several embodiments of the invention, the at least two power terminals 214 and/or the at least two sleeve inserts 216 are made from ferromagnetic or a paramagnetic material and the at least two load terminals of the electronic device may be formed as permanent magnets, such that, when brought in contact, the at least two load terminals are magnetically and mechanically coupled to the at least two power terminals 214 and/or the at least two sleeve inserts 216.

Moreover, the insertion of the at least two load terminals into the at least two respective holes 114 would prevent relative rotation between the controller 100 and the electronic device connected to the controller 100. In addition, the at least two conducting elements 208 are configured to make physical contact with the at least two respective power terminals 214 for the transfer of electrical power from the power source 210 to the at least two power terminals 214. In addition, at least two insulator elements 212 have been provided between the at least two respective power terminals 214 and the lower PCB surface 211 facing towards the at least two power terminals 214. The at least two insulator elements 212 ensure that only the at least two conducting elements 208 make electrically conducting contact with the at least two respective power terminals 214.

Figure 3:
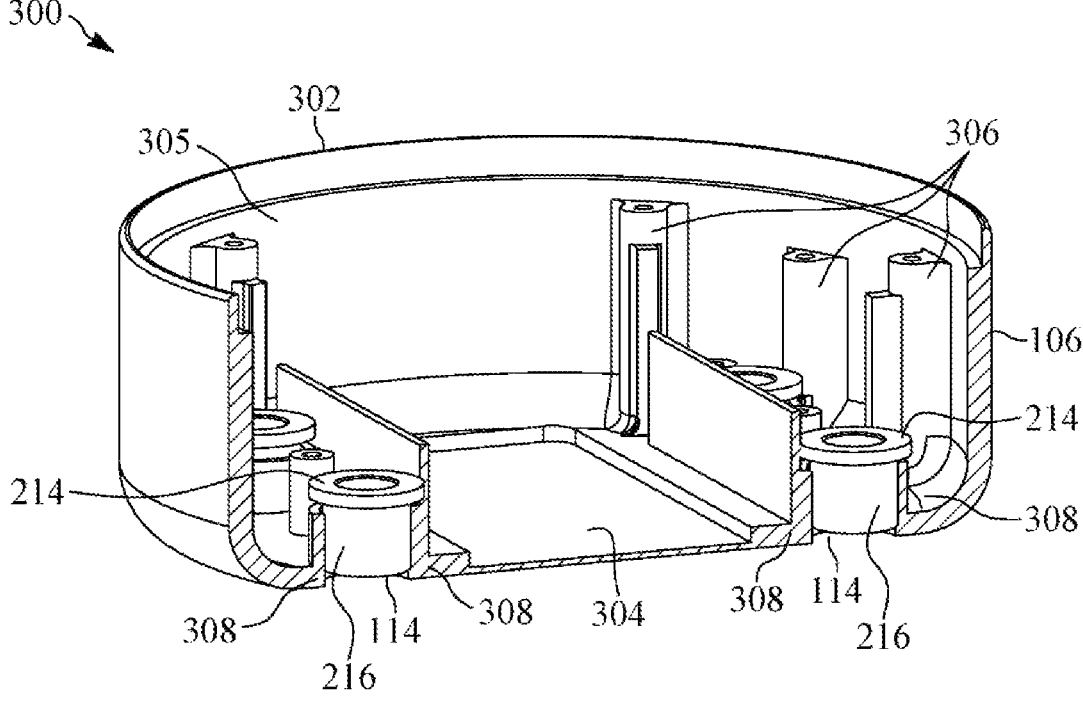
FIG. 3 illustrates a partial sectional view of an assembly of a lower portion of the standalone controller, a power terminal, and a sleeve insert, in accordance with an embodiment of the present invention.

FIG. 3 illustrates a partial sectional view of an assembly 300 of the lower portion 106 of the controller 100, the at least two power terminals 214, and the at least two sleeve inserts 216, in accordance with an embodiment of the present invention. The lower portion 106 includes a perimeter wall 302 and a lower inner surface 304 acting as a floor of the lower portion 106. A plurality of rotation-arresting protrusions 306 have been provided on an inner surface 305 of the perimeter wall 302. The plurality of rotation arresting protrusions 306 are configured to be received in the plurality of respective rotation arresting slots 207 of the PCB 206, thereby arresting relative rotation between the PCB 206 and the lower portion 106. Further, sealing means 308 have been provided at the at least two holes 114 where the at least two respective power terminals 214 and the at least two respective sleeve inserts 216 make contact with the lower portion 106 for ingress protection from dust, water, and other environmental elements. The sealing means 308, in that regard, may include but is not limited to semi-solid sealants, gels, sealing rings, gaskets, water-resistant and dust-resistant coatings, etc.

Figure 4:
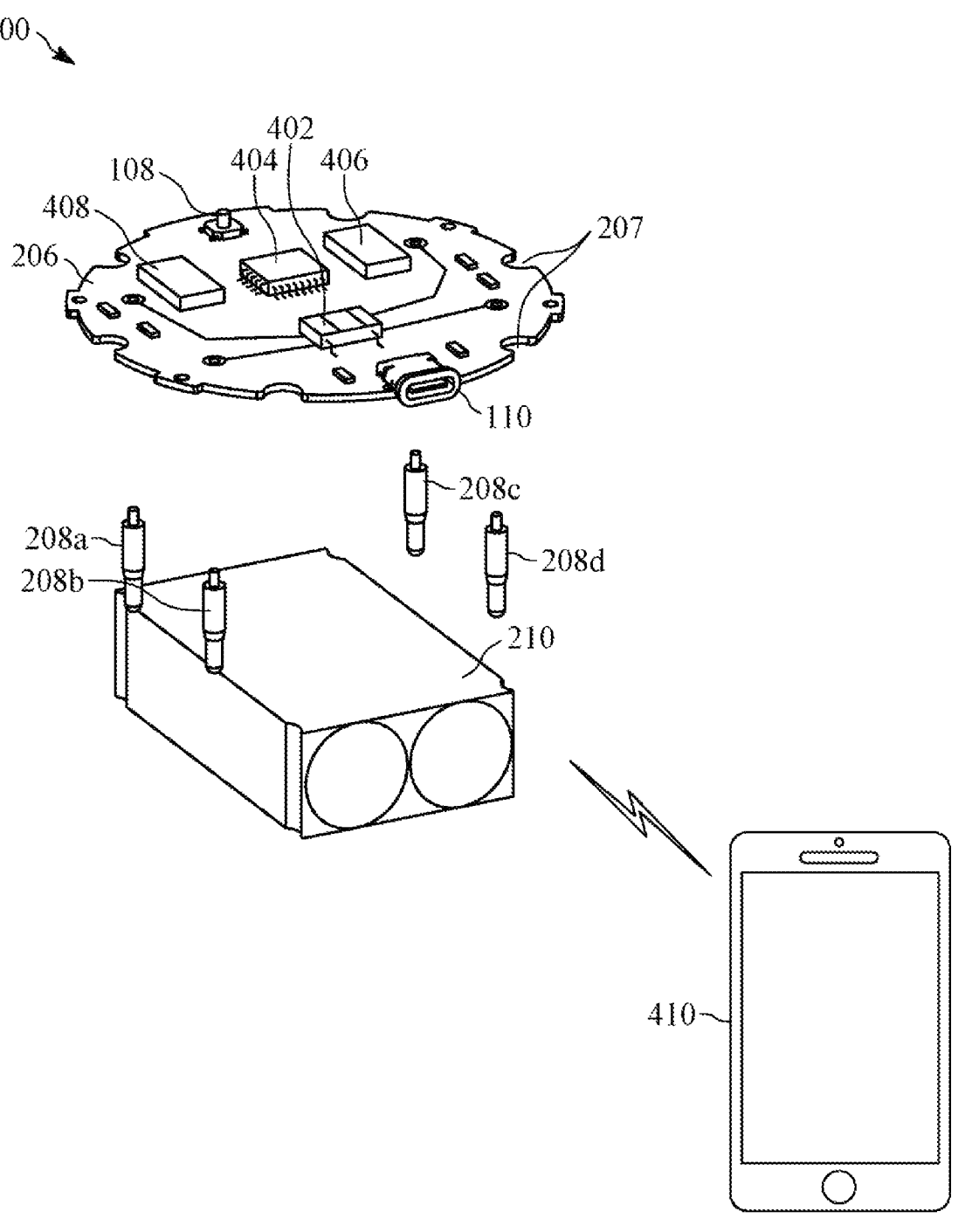
FIG. 4 illustrates an exploded view of a control module of the standalone controller, in communication with a user computing device, in accordance with an embodiment of the present invention.

FIG. 4 illustrates an exploded view of a control module 400 of the controller 100, in communication with a user computing device 410, in accordance with an embodiment of the present invention. A reverse polarity protection element 402 has been provided between the at least one conducting element (208a and/or 208b) maintained at the positive potential and the least another conducting element (208c and/or 208d) maintained at the negative potential. The reverse polarity protection element 402 is configured to protect the electronic components of the controller 100 from damage in case the power supply polarity is reversed. In that regard, the reverse polarity protection elements 402 may include any one or more of a simple diode, a bridge rectifier, a P-Channel MOSFET, a Schottky diode, and the like.

In several embodiments of the invention, the control module 400 may further include a processor 404, a memory unit 406, and a communication interface 408 electrically coupled to the PCB 206. In that regard, the memory unit 406 may be coded with machine-readable instructions that when executed by the processor 404 may enable the processor 404 to receive, from the user computing device 410, through the communication interface 408, the control input signal corresponding to modifying the operational characteristics of the electronic device. Furthermore, the processor 404 may be enabled to modify the operational characteristics of the electronic device in response to the receipt of the control input signal.

Figure 5:
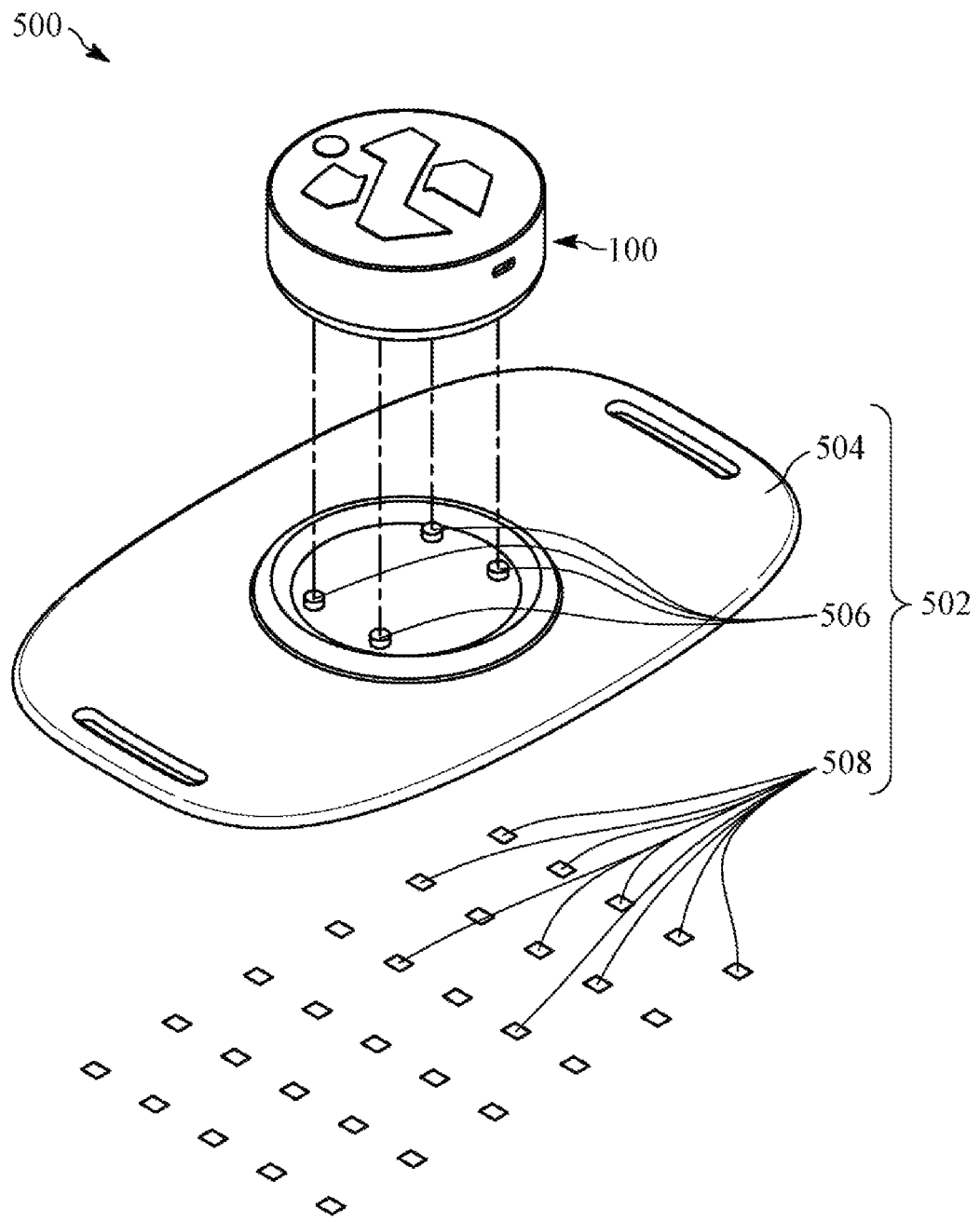
FIG. 5 illustrates an exploded view of an assembly of the standalone controller with a stimulation pad acting as an electronic device, in accordance with an embodiment of the present invention.

FIG. 5 illustrates an exploded view of an assembly 500 of the controller 100 with a stimulation device 502 acting as the electronic device, in accordance with an embodiment of the present invention. The stimulation device 502 may be used as a therapeutic and/or recreational device. The stimulation device 502 includes a wearable pad 504 that may be worn on a suitable part of the body of a user. In that regard, the stimulation device 502 may be embodied as a face mask, an arm gear, a headband, a waist belt, and the like. The stimulation device 502 further includes at least two load terminals 506 attached to the wearable pad 504. The at least two load terminals 506 are embodied in the form of protruding pins configured to be received within the at least two respective holes 114 of the controller 100, to power the stimulation device 502. The controller 100 may additionally perform monitoring and control of the operational characteristics of the stimulation device 502. The stimulation device 502 further includes a plurality of stimulation elements 508 connected on a side opposite to the side to which the controller 100 has been connected.

The plurality of stimulation elements 508 may be selected from a group consisting of irradiation sources, heating elements, cooling elements, vibration elements, electrodes, and combinations thereof. Furthermore, irradiation sources may be selected from a group consisting of Light Emitting Diodes (LEDs), lasers, and incandescent irradiation sources. Additionally, the irradiation sources may be configured to operate in one or more of a pulse mode and a continuous mode. In that, the operational characteristics of the irradiation sources may include wavelengths of the electromagnetic radiation emitted by the irradiation sources, mode of operation of the irradiation sources, and pulse width of pulses of the emitted electromagnetic radiation in a pulsed mode of operation of the irradiation sources, etc.

In case of a stimulation element being a heating element, the heating elements may be selected from a group consisting of metal heating elements, ceramic heating elements, semiconductor heating elements, thick film heating elements, polymer-based heating elements, composite heating elements, and combination heating elements. In the case of the stimulation element being a cooling element, the cooling elements may be a thermoelectric cooler, also known as a Peltier heat pump. In the case of a stimulation element being an electrode, the electrode may be provided at an end of a conductor. The electrode may then be able to provide Transcutaneous Electrical Nerve Stimulation (TENS), Electronic Muscle Stimulation (EMS), and Microcurrent Electrical Therapy (MET) to the body of a user.

TENS therapy uses low-voltage currents to provide pain relief. Electrical impulses are delivered through electrodes placed on the surface of the body of the user. The electrodes are placed at or near nerves where the pain is located or at certain known trigger points. EMS therapy is similar to TENS therapy, the difference being that EMS is applied to key muscle groups instead of a generalized application. The electrical signals in EMS cause certain muscles to undergo contractions and tightening. Moreover, electrical impulses in EMS are stronger when compared with TENS therapy. MET in contrast uses a current of amplitude less than 1 milliampere and a frequency of 0.5 Hz and is indicated for the treatment of pain.

FIG. 6 illustrates a system 600 including a plurality of controllers 100a, 100b, 100c, and 100d (all identical to the controller 100) coupled to a plurality of respective stimulation devices 502a, 502b, 502c, and 502d, the plurality of controllers 100a, 100b, 100c, and 100d communicating through a communication network 610, in accordance with an embodiment of the present invention. The communication network 610 in that regard may be set up following protocols described in IEEE 802.x (Ethernet and Wi-Fi), HSDPA, HSPA, ZigBee, Bluetooth, Controller Area Network (CAN) and the like. In that regard, the plurality of controllers 100a, 100b, 100c, and 100d may communicate through wired and/or wireless means. In that regard, one controller of the plurality of controllers 100a, 100b, 100c, and 100d, selected based on a predetermined criterion, is configured to act as a master controller, and the remaining controllers of the plurality of controllers 100a, 100b, 100c, and 100d are configured to act as slave controllers. In that regard, the slave controllers will receive control input signals from the master controller, and the slave controllers are configured to operate in accordance with the respective control input signals received from the master controller.

In the given example, the plurality of stimulation devices 502a, 502b, 502c, and 502d have been embodied as a facemask 502a, two armbands 502b and 502d, and one waist-belt 502c. In an exemplary scenario, the controller 100a provided on the facemask 502a is chosen to be the master controller, based on the criteria that psychological state of a user 602 has to be maintained at a steady state, and the controller 100a is closest to the brain of the user 602. All the remaining controllers 100b, 100c, and 100d have been designated as slave controllers. The master controller 100a and the plurality of slave controllers 100b, 100c, and 100d may be able to monitor biomarkers such as brainwaves, pulse rate, blood pressure, oxygen saturation, body temperature, etc. of the user 602 to determine the psychological state of the user 602. Therefore, based on the determined biomarkers, the master controller 100a may reconfigure itself and send control input signals to the plurality of slave controllers 100b, 100c, and 100d to modify operational characteristics of the plurality of respective stimulation elements 508a, 508b, 508c, and 508d to provide a stabilizing effect to the psychological state of the user 602. In that regard, the user 602 may be treated with red and Infrared light therapy, vibratory massage, alternate heating and cooling of muscles, etc. In that regard, the controller 100a may monitor the effect of stimulation provided by the plurality of stimulation devices 502a, 502b, 502c, and 502d by monitoring the brainwave activity of the user 602.

FIG. 7 illustrates method 700 of manufacturing the controller 100, in accordance with an embodiment of the present invention. The method begins at Step 702, by fabricating the housing 102 defining the enclosed cavity. The housing 102 includes the upper portion 104 and the lower portion 106. At Step 704, the at least two holes 114 are provided in the lower portion 106. In that regard, the at least two holes 114 may be blind holes, through holes, countersunk holes, or counterbore holes. At Step 706, the at least two power terminals 214 are provided, such that, the at least two power terminals 214 are located in the at least two respective holes 114. Moreover, the contacts between the lower portion 106 and the at least two power terminals 214 are sealed at locations of the at least two respective holes 114 for ingress protection. Also, the at least two power terminals 214 are made from a ferromagnetic or a paramagnetic material.

In several embodiments of the invention, the at least two power terminals 214 are provided within the enclosed cavity at the predetermined depth from the lower outer surface 112 of the lower portion 106. The at least two power terminals 114 are accessible through the at least two respective holes 114 provided in the lower portion 106. The at least two holes 114 are configured to receive therewithin the at least two respective load terminals 506 of the electronic device 502, the at least two load terminals 506 protruding outwards from the electronic device 502.

At Step 708, the PCB 206 is located within the enclosed cavity defined by the upper portion 104 and the lower portion 106. At Step 710, the power source 210 is electrically coupled to the PCB 206. At Step 712 the at least two conducting elements 208 are electrically coupled to the PCB 206 for transmitting electrical power received from the power source 210. The at least one conducting element (for example, 208a or 208b) is maintained at a positive potential and the at least one other conducting element (for example, 208c or 208d) is maintained at a negative potential. The at least two conducting elements 208 are configured to make physical contact with the at least two respective power terminals 214. In several embodiments of the invention, the reverse polarity protection element 402 is electrically coupled to the PCB 206 between the at least one conducting element maintained at the positive potential and the at least one other conducting element maintained at the negative potential.

In several embodiments of the invention, the user interface 108 is provided. The user interface 108 is configured to receive the control input signal corresponding to modifying operational characteristics of the electronic device, and the operational characteristics of the electronic device are modified in response to the receipt of the control input signal through the user interface. In several alternate embodiments of the present invention, the at least two insulator elements 212 are provided between the at least two power terminals 214 and the lower PCB surface 211 facing towards the at least two power terminals 214, such that, only the at least two conducting elements 208 make electrically conducting contacts with the at least two respective power terminals 214.

The embodiments of the invention as described above offer several advantages. For instance, a single standalone controller can be used for several electronic devices with a minimal amount of reprogramming, leading to costs and material savings. The standalone controller can be configured to operate both on DC power available through batteries or through AC power harnessed from an AC power supply. The standalone controller as described above is simple in construction and convenient to repair and reconstruct thereby saving material wastages. The choice of using a shielding material as a material of the housing prevents the users from EMF generated by electronic components of the standalone controller. The spring-loaded dowel pins compensate for wear and tear, and thermal expansion or contraction.

Various modifications to these embodiments are apparent to those skilled in the art, from the description and the accompanying drawings. The principles associated with the various embodiments described herein may be applied to other embodiments. Therefore, the description is not intended to be limited to the embodiments shown along with the accompanying drawings but is to provide the broadest scope consistent with the principles and the novel and inventive features disclosed or suggested herein. Accordingly, the invention is anticipated to hold on to all other such alternatives, modifications, and variations that fall within the scope of the present invention and appended claims.

The invention claimed is:

1. A standalone controller for detachably attaching to an electronic device to perform monitoring and control of operational characteristics of the electronic device, the standalone controller comprising:
   a housing defining an enclosed cavity, the housing comprising an upper portion and a lower portion;
   at least two power terminals, the at least two power terminals located in at least two respective holes provided in the lower portion;
   a Printed Circuit Board (PCB) located within the enclosed cavity;
   a power source electrically coupled to the PCB, and

at least two conducting elements electrically coupled to the PCB for transmitting electrical power received from the power source, at least one conducting element maintained at a positive potential and at least one other conducting element maintained at a negative potential, the at least two conducting elements configured to make physical contact with the at least two respective power terminals;
   wherein the at least two power terminals are made from a ferromagnetic or a paramagnetic material, and
   wherein contacts between the lower portion and the at least two power terminals are sealed at locations of the at least two respective holes for ingress protection.

2. The standalone controller as claimed in claim 1, wherein the at least two power terminals are provided within the enclosed cavity at a predetermined depth from a lower outer surface of the lower portion, the at least two power terminals accessible through the at least two respective holes provided in the lower portion, the at least two holes configured to receive therewithin at least two respective load terminals of the electronic device.

3. The standalone controller as claimed in claim 1, wherein the at least two conducting elements comprise at least two dowel pins that are spring loaded.

4. The standalone controller as claimed in claim 1, further comprising a reverse polarity protection element electrically coupled to the PCB.

5. The standalone controller as claimed in claim 4, wherein the reverse polarity protection element comprises a bridge rectifier circuit.

6. The standalone controller as claimed in claim 1, wherein:
   the power source comprises rechargeable batteries,
   a power transfer port is electrically coupled to the power source, and
   the power source is configured to both receive and deliver electrical power through the power transfer port.

7. The standalone controller as claimed in claim 1, further comprising a user interface, the user interface configured to receive a control input signal corresponding to modifying operational characteristics of the electronic device, the operational characteristics of the electronic device modified in response to the receipt of the control input signal through the user interface.

8. The standalone controller as claimed in claim 1, wherein the electronic device is a therapeutic and/or a recreational device comprising a plurality of stimulation elements, the plurality of stimulation elements selected from a group consisting of irradiation sources, heating elements, cooling elements, vibration elements, electrodes and combinations thereof.

9. The standalone controller as claimed in claim 8, wherein, in case of the plurality of stimulation elements comprising the irradiation sources, the operational characteristics comprise wavelength of the electromagnetic radiation emitted by the irradiation sources, mode of operation of the irradiation sources, and pulse width of pulses of the emitted electromagnetic radiation in a pulsed mode of operation of the irradiation sources.

10. The standalone controller as claimed in claim 1, further comprising at least two insulator elements provided between the at least two power terminals and a lower PCB surface facing towards the at least two power terminals, such that, only the at least two dowel pins make electrically conducting contacts with the at least two respective power terminals.

11. The standalone controller as claimed in claim 1, wherein the upper portion comprises cutouts for releasing Electromotive force (EMF) generated by electronic components within the housing from the upper portion and away from the electronic device.

12. The standalone controller as claimed in claim 1, wherein the housing is made from a shielding material to prevent Electromotive force (EMF) generated by electronic components within the housing from leaking from the lower portion of the housing.

13. The standalone controller as claimed in claim 1, further comprising a processor, a memory unit, and a communication interface electrically coupled to the PCB, the memory unit comprising machine-readable instructions that when executed by the processor, enable the processor to:

receive, from a user computing device, through the communication interface, a control input signal corresponding to modifying operational characteristics of the electronic device; and modify the operational characteristics of the electronic device in response to the receipt of the control input signal.

14. A standalone controller for detachably attaching to an electronic device to perform monitoring and control of operational characteristics of the electronic device, the standalone controller comprising:

a housing defining an enclosed cavity, the housing comprising an upper portion and a lower portion;

at least two power terminals, the at least two power terminals located in two respective holes provided in the lower portion;

a Printed Circuit Board (PCB) located within the enclosed cavity;

a power source electrically coupled to the PCB;

at least two conducting elements electrically coupled to the PCB for transmitting electrical power received from the power source, at least one conducting element maintained at a positive potential and at least one other conducting element maintained at a negative potential, the at least two conducting elements configured to make physical contact with the at least two respective power terminals; and a reverse polarity protection element electrically coupled to the PCB, wherein the at least two power terminals are made from a ferromagnetic or a paramagnetic material, wherein contacts between the lower portion and the at least two power terminals are sealed at locations of the at least two respective holes for ingress protection, and wherein the housing is made from a shielding material to prevent Electromotive force (EMF) generated by electronic components within the housing from leaking to surrounding environment of the housing.

15. The standalone controller as claimed in claim 14, wherein the at least two power terminals are provided within the enclosed cavity at a predetermined depth from a lower outer surface of the lower portion, the at least two power terminals accessible through the at least two respective holes provided in the lower portion, the at least two holes configured to receive therewithin at least two respective load terminals of the electronic device.

16. The standalone controller as claimed in claim 14, wherein the at least two conducting elements comprise at least two dowel pins that are spring loaded.

17. The standalone controller as claimed in claim 14, wherein the upper portion comprises cutouts for releasing Electromotive force (EMF) generated by electronic components within the housing from the upper portion and away from the electronic device.

18. A system of a plurality of standalone controllers for detachably attaching to a plurality of respective electronic devices to perform monitoring and control of operational characteristics of the plurality of electronic devices, each one of the plurality of standalone controllers comprising:

a housing defining an enclosed cavity, the housing comprising an upper portion and a lower portion, at least two power terminals, the at least two power terminals located in at least two respective holes provided in the lower portion, a Printed Circuit Board (PCB) located within the enclosed cavity;

a power source electrically coupled to the PCB; and at least two conducting elements electrically coupled to the PCB for transmitting electrical power received from the power source, at least one conducting element maintained at a positive potential and at least one other conducting element maintained at a negative potential, the at least two conducting elements configured to make physical contact with the at least two respective power terminals, wherein the at least two power terminals are made from a ferromagnetic or a paramagnetic material, wherein contacts between the lower portion and the at least two power terminals are sealed at locations of the at least two respective holes for ingress protection, and wherein the plurality of standalone controllers are configured communicate with each other through wired and/or wireless means, such that, one standalone controller of the plurality of standalone controllers, selected based on predetermined criterion, is configured to act as a master controller and remaining standalone controllers of the plurality of standalone controllers are configured to act as slave controllers, the slave controllers configured to operate in accordance with respective control input signals received from the master controller.

19. The system as claimed in claim 18, wherein the at least two conducting elements comprise at least two dowel pins that are spring loaded.

20. The system as claimed in claim 18, wherein the housing is made from a shielding material to prevent Electromotive force (EMF) generated by electronic components within the housing from leaking from the lower portion of the housing.

\* \* \* \* \*